United States Patent
Yoo

(10) Patent No.: US 6,438,150 B1
(45) Date of Patent: Aug. 20, 2002

(54) EDGE-EMITTING SEMICONDUCTOR LASER HAVING ASYMMETRIC INTERFERENCE FILTERS

(75) Inventor: Sung Joo Yoo, Davis, CA (US)

(73) Assignee: Telecordia Technologies, Inc., Morristown, NJ (US)

(*) Notice: Subject to any disclaimer, the term of this patent is extended or adjusted under 35 U.S.C. 154(b) by 0 days.

(21) Appl. No.: 09/264,997

(22) Filed: Mar. 9, 1999

(51) Int. Cl.⁷ .................................................. H01S 5/00
(52) U.S. Cl. .............................. 372/49; 372/45; 372/92; 372/99
(58) Field of Search .............................. 372/20, 45, 46, 372/50, 92, 96, 97, 99, 49

(56) References Cited

U.S. PATENT DOCUMENTS

| | | | |
|---|---|---|---|
| 3,578,848 A | 5/1971 | Austin | 350/320 |
| 3,614,188 A | 10/1971 | Seeley et al. | 350/1 |
| 4,009,453 A | 2/1977 | Mahlein et al. | 331/94.5 C |
| 4,949,350 A | 8/1990 | Jewell et al. | 372/45 |
| 5,029,176 A | 7/1991 | Chang-Hasnain | 372/50 |
| 5,034,958 A | 7/1991 | Kwon et al. | 372/45 |
| 5,224,113 A | 6/1993 | Tsang | 372/45 |
| 5,434,874 A * | 7/1995 | Fouquet et al. | 372/20 |
| 5,612,968 A | 3/1997 | Zah | 372/50 |

OTHER PUBLICATIONS

"Multiwavelength light source with intergrated DFB laser array and star coupler for WDM lightwave communications," International Journal of High Speed Electronics and Systems, vol. 5, No. 1, 1994.

"Monolithic integrated multiwavelength laser arrays for WDM lightwave system," Optoelectronics—Devices and Technologies, vol. 9, No. 2, 1994.

* cited by examiner

Primary Examiner—Paul Ip
Assistant Examiner—Cornelius H Jackson
(74) Attorney, Agent, or Firm—William A. Schoneman; Joseph Giordano

(57) ABSTRACT

An edge-emitting laser formed in an opto-electronic chip and having an emission wavelength determined by dielectric interference filter formed on opposing facets between which said laser extends. The two interference filter are each respective Fabry-Perot etalon filters having two interference mirrors sandwiching a resonant dielectric cavity layer so that the filter manifests a flat reflectance spectrum with a deep reflectance notch in its center. The two filters are fabricated with wavelengths of their notches differing by about 2%. The sum of the two filter transmittances represents round-trip cavity loss and has a double-peaked shape with a sharp minimum between the two notch wavelengths. The wavelength of the sum minimum determines the lasing wavelength without the need for a Bragg grating being incorporated within the chip. The invention can be applied to multi-wavelength edge-emitting lasers including multiple laser stripes by applying filters of different wavelengths to the ends of different stripes.

12 Claims, 6 Drawing Sheets

EDGE-EMITTING SEMICONDUCTOR LASER HAVING ASYMMETRIC INTERFERENCE FILTERS

FIELD OF THE INVENTION

The invention relates generally to semiconductor lasers. In particular, the invention relates to mirrors defining the optical cavity of a semiconductor edge-emitting laser.

BACKGROUND ART

Semiconductor lasers are being increasingly used as the light source for telecommunication systems utilizing optical fibers as the transmission medium. The laser is positioned to irradiate one end of the fiber, and an electrical signal either directly modulates the laser or controls a modulator through which the laser output passes before it enters the fiber. Optical fiber has the capability of transmitting the optical signal for hundreds of kilometers without regeneration or amplification. An optical detector receives the optical output at the other end of the fiber, and the electrical signal output by the detector corresponds to the modulation signal used at the input end of the fiber.

Semiconductor lasers have several advantages. They operate at relatively high efficiency and are relatively rugged. A waveguide laser produces an optical output that is easily coupled into a single-mode optical fiber. Semiconductor lasers can be fabricated to emit in the two portions of the optical spectrum most favored for the transmission over silica fiber, the 1310 nm band and the 1550 nm band. These two bands are achieved by using semiconductor materials from the AlInGaAs and InGaAsP families grown on InP substrates.

The precise lasing frequency is determined by a number of factors. A typical edge-emitting semiconductor laser 10 is illustrated schematically in FIG. 1. A chip 11 of the semiconductor composition capable of emitting in the desired optical regime includes a p-type layer 12 and an n-type layer 14 separated by an intrinsic active layer 16, which may include one or more quantum wells. The substrate under the lower layer 16 is not explicitly shown. Optical waveguiding means are included to confine light in both the vertical direction and in the horizontal direction perpendicular to the plane of the illustration. Viewed from above, the laser and associated electrode and waveguiding structure appear as a stripe extending between the chip facets. The vertical confinement structure is closely associated with the intrinsic layer 16 and preferably is implemented as a distributed Bragg grating or reflector (DBR) 17 having an optical period P generally corresponding to the desired emission at wavelength $\lambda_0$. Two mirrors 18, 20 are formed on the chip facets and define the ends of an optical cavity of length L. The chip facets are usually fabricated by cleaving the crystalline substrate along a cleavage plane so that the facets are mirror smooth and perpendicular. As such, the facets themselves may be sufficient to acts as mirrors, at least on the output side, but additional metal coatings may be deposited. One mirror 18 is made as reflective as possible while the other, output mirror has a small but finite transmissivity to allow output of laser light 22 at wavelength $\lambda_0$. Electrodes 24, 26 are contacted to the p-type and n-type layers 12, 14 and a power supply 28 forward biases the p-n junction. For telecommunications, the power supply 28 can be electrically modulated with a data signal, or alternatively a separate optical modulator can receive CW laser light 22 and modulate it according to the data signal.

In an edge-emitting laser, the cavity length L is typically of the order of millimeters or greater and thus much longer than the lasing wavelength $\lambda_0$ so that a large number of potential axial waveguide modes 30 exist, as illustrated in the power/gain spectral diagram of FIG. 2. Lasing occurs for a particular mode 30 when, at the wavelength of the mode, the round-trip gain through the optical cavity exceeds the round-trip loss. If this condition is satisfied for more than one mode 30, usually the mode with the largest excess gain draws power away from the less favored modes. An optical gain spectrum 32 in the amplifying portion of the laser is determined primarily by the precise composition of the ternary or higher-order compound semiconductor used to produce the desired optical emission wavelength, and in these materials the gain spectrum 32 is relatively wide. The gain is often expressed in terms of an absorption coefficient $\alpha$ per unit length with the round-trip gain being equal to $2\alpha L$. The gain bandwidth is usually greater than 10 nm and often much greater. The loss spectrum is composed of at least two components. The mirror loss 34 is small and essentially flat if the mirrors are metallic or rely on the semiconductor/air interface. On the other hand, the Bragg transmission spectrum 36 is relatively sharply peaked with a peak position at P determined by the Bragg grating 16. Transmission bandwidths of 0.3 nm are typical. Any additional loss in the waveguide is included in the absorption coefficient a, which in a laser has a sign that denotes power growth. Typically the internal loss is relatively flat over the wavelength bands of interest. The mode 30 that experiences the largest value of gain less loss is the one that lases. The resultant lasing wavelength peak is very narrow.

The narrow laser bandwidth and the control of the emission frequency by the setting of the physical pitch of the feedback grating allows multiple lasers emitting at slightly different wavelengths to be integrated on a single semiconductor substrate. Such a multi-wavelength laser is particularly advantageous for a wavelength-division multiplexing (WDM) telecommunication system in which a single optical fiber carries multiple optical signals which have slightly different wavelengths and which are separately modulated by respective data signals. WDM can multiply the transmission capacity of a fiber by the number of wavelength, which in current systems may be from 4 to 40 or even higher. For the larger number of WDM channels, the WDM wavelengths are separated by approximately 1 nm. Zah describes an example of such an integrated multi-wavelength laser in U.S. Pat. 5,612,968, in which he references fabricational techniques described by Zah et al. in "Multiwavelength light source with integrated DFB laser array and star coupler for WDM lightwave communications," *International Journal of High Speed electronics and Systems*, vol. 5, no. 1, 1994, and in "Monolithic integrated multiwavelength laser arrays for WDM lightwave system," *Optoelectronics—Devices and Technologies*, vol. 9, no. 2, 1994.

However, a useful WDM network includes some amount of optical switching so that an optical fiber may be transmitting and a receiver array may be receiving optical signals originating from multiple transmitting sites. Any overlap of nominally different wavelengths at any point in the network must be avoided so that the wavelengths of the different emitters must be tightly registered. But, supposedly identical laser arrays may be transmitting at somewhat different wavelengths. DBR lasers rely for their emission control on the e-beam writing of the grating, which must be controlled to 0.03 nm for a 240 nm pitch. Such fine lithography imposes a major problem in fabrication and reduces yield below an economically useful level. Furthermore, the semiconductor composition of the waveguide and the Bragg grating introduces a large temperature dependence, with a typical wavelength drift with temperature of 0.1 nm/° C. As a result, the temperature must be stabilized at all times and at all transmitting sites. Such control is possible, but expensive and operationally difficult in a distributed commercial environment.

An alternate laser structure is the vertical-cavity surface-emitting laser 40 schematically illustrated in FIG. 3 following the original disclosure by Jewell et al. in U.S. Pat. No. 4,949,350. A tall semiconductor stack having a diameter of about 1 μm is etched from layers epitaxially grown on an n-type substrate 42. From the bottom up, the stack includes an n-type semiconductor lower interface mirror 44, a n-type lower spacer layer 46, an active layer 48 including one or more quantum wells, a p-type upper spacer layer 50, and a p-type semiconductor upper interference mirror 52. A gold layer 54 serves both as a reflector and a contact layer for an upper electrode 56. A lower electrode 56 is contacted to the substrate 42. The interference mirrors 44, 52 comprise a large number of semiconductor layers having a periodic variation in the dielectric constant with the period corresponding to the desired wavelength $\lambda_0$ of laser light 22 emitted from the bottom of substrate 42. The mirrors 44, 52 define the ends of an optical cavity of optical length S, which is usually $\lambda_0/2$ or an odd multiple thereof. The illustration does not distinguish the optical length from the physical length. The spacers 46, 50 provide the thickness for this length S not provided by the thin active layer 48. The vertical-cavity laser supports usually only a single longitudinal mode. As should be apparent from the disclosure of Chang-Hasnain in U.S. Pat. No. 5,029,176 the lasing wavelength is primarily determined by the cavity length S and not by the spacing in the semiconductor interference mirrors 44, 52. That is, the mirrors transmission spectra are wide enough to encompass significant variations in the cavity length S. The complex semiconductor interference mirrors are required in the illustrated configuration because of the need to inject current through both ends of the laser stack and to extract light through at least one end.

Subsequent work has developed vertical-cavity lasers which emit from the front surface of the chip and utilize an dielectric stack interference mirror on the front surface. See, for example, U.S. Pat. 5,034,958 to Kwon et al.

The vertical-cavity lasers exhibit increased thermal effects because of the isolated geometry of their semiconductor stacks. The lasing wavelength $\lambda_0$ is determined by the optical length of the cavity. Both the physical length and the semiconductor dielectric constant, upon both of which the optical length depends, are temperature dependent so fine temperature control is required if a stable emission wavelength is to be achieved.

Edge-emitting solid state lasers are also used as pump sources for erbium-doped fiber amplifiers (EDFAs), which require an intense pumping signal at either 980 or 1480 nm to amplify optical signals in the 1550 nm band. The preferred 980 nm pump signal is produced by AlGaAs or InGaAsP lasers grown on GaAs substrates while the 1480 nm pump signal is produced by AlInGaAs or InGaAsP lasers grown on InP. Both the pump and data signals are coupled into the EDFA and collinearly propagate on it. Conventionally, no wavelength selection is applied to the pump laser, and the gain-minus-loss spectrum is determined by the optical gain spectrum. The lack of mode selection, however, produces a multi-mode emission or jitter between modes of slightly different wavelengths. Although all the pump modes effectively pump the data signals, it has been found that the resultant amplification is unduly noisy so as to increase the noise figure of the EDFA. It is desired to obtain single-mode pump power without the need for complex frequency selection.

Accordingly, it is desired to design a semiconductor laser in which the emission wavelength is stable with temperature and does not require ultra-precise lithography.

SUMMARY OF THE INVENTION

The invention may be summarized as a semiconductor edge-emitting laser having dielectric interference filters attached to at least one of the opposed facets of the chip so as to define the optical cavity. The two filters are designed for maximum transmittances at two wavelengths closely bracketing the design emission wavelength. The sum of the transmittances, which represent cavity mirror loss, is doubly peaked with a minimum at the emission wavelength. The much broader gain spectrum is designed to peak at or near the transmittance minimum, whereby lasing occurs at the wavelength of the transmittance minimum.

In a multi-wavelength opto-electronic chip having multiple laser stripes extending in parallel between opposed chip facets, pairs of dielectric interference filters are attached to the opposed ends of each stripe, and the resonant frequencies of the respective pairs are chosen to bracket the frequency at which the respective stripe is intended to lase.

DETAILED DESCRIPTION OF THE PREFERRED EMBODIMENTS

Figure 1:
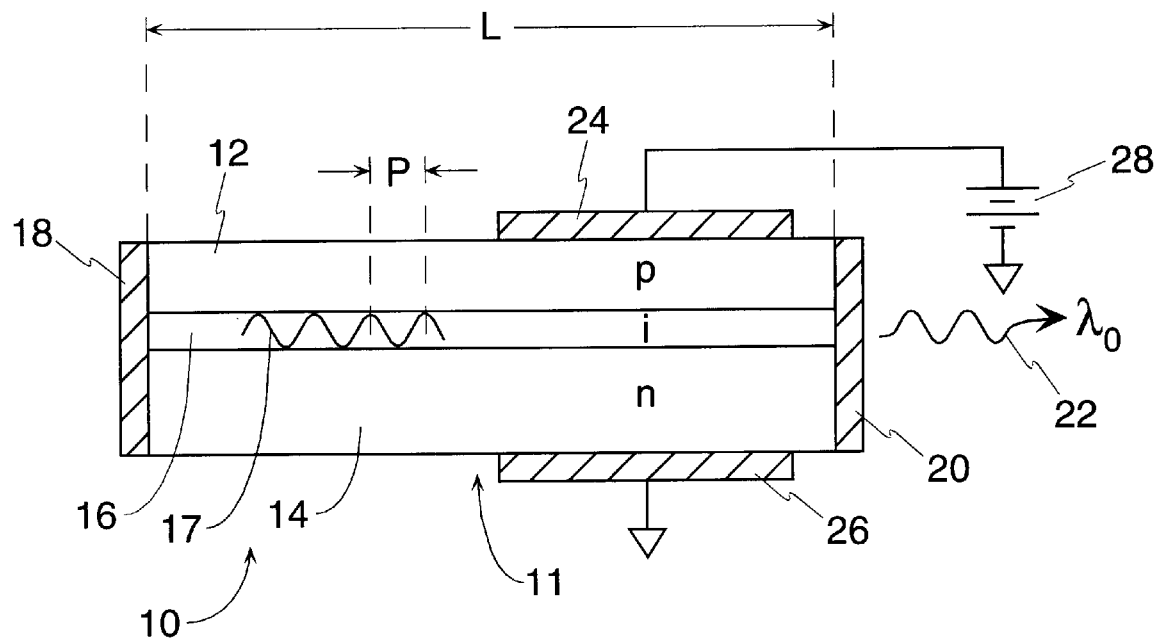
FIG. 1 is a schematic cross-sectional view of an edge-emitting laser.
Figure 2:
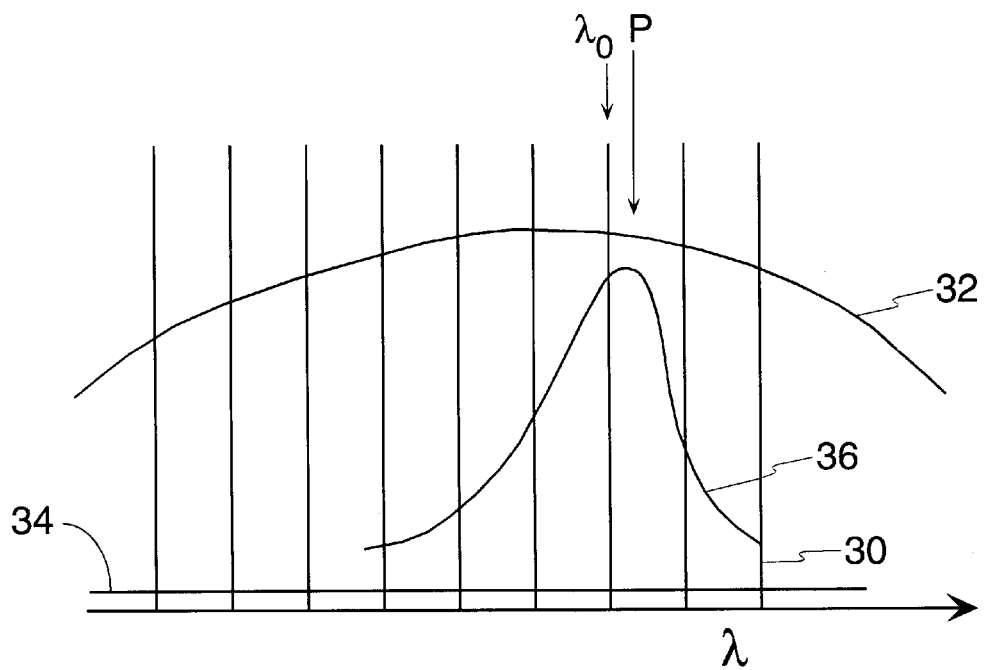
FIG. 2 is a graph illustrating the gain and loss spectra in an edge-emitting laser.
Figure 3:
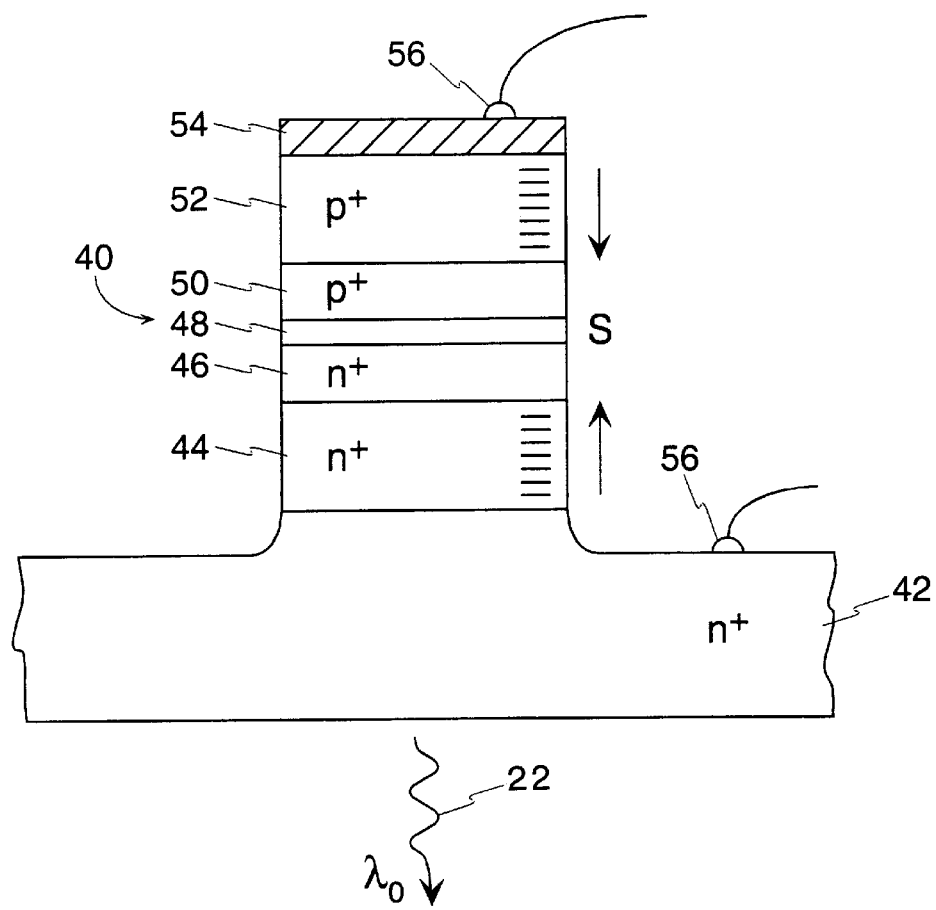
FIG. 3 is a schematic cross-sectional view of a surface-emitting laser.
Figure 4:
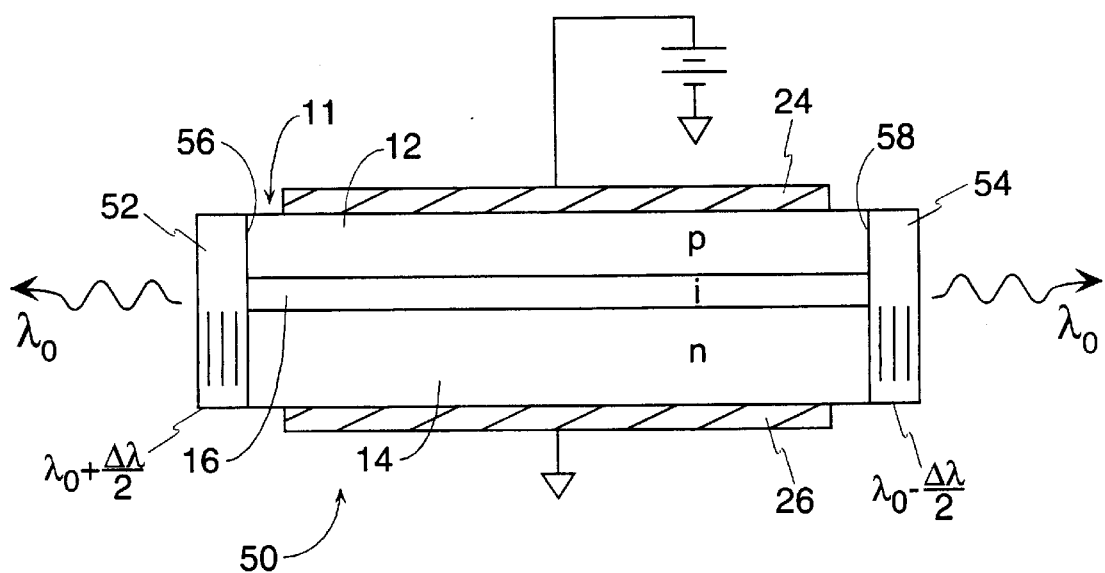
FIG. 4 is a schematic cross-sectional view of a first embodiment of an edge-emitting laser of the invention.

An edge-emitting semiconductor laser 50 of the invention is illustrated schematically in the cross-sectional view of FIG. 4. It resembles the conventional laser 10 of FIG. 1 with two major differences. Narrow-band dielectric interference filters 52, 54 of slightly different resonant wavelengths are deposited on the two facets 56, 58 of the semiconductor chip 11. By narrow band is meant that the full-width, half-maximum width of the wavelength peak is no more than 5%, preferably no more than 2%, and most preferably no more than 1% of the wavelength at the center of the peak. They must differ by a sufficient amount, preferably greater than 0.2% to allow for variations in their growth not obliterating the intervening minimum in their sum. The combination of the two filters 52, 54 produces a sufficiently narrow cavity loss band that they determine the lasing wavelength $\lambda_0$. As a result, the distributed Bragg reflector is not needed in an axially undefined waveguiding intrinsic layer 16.

Figure 5:
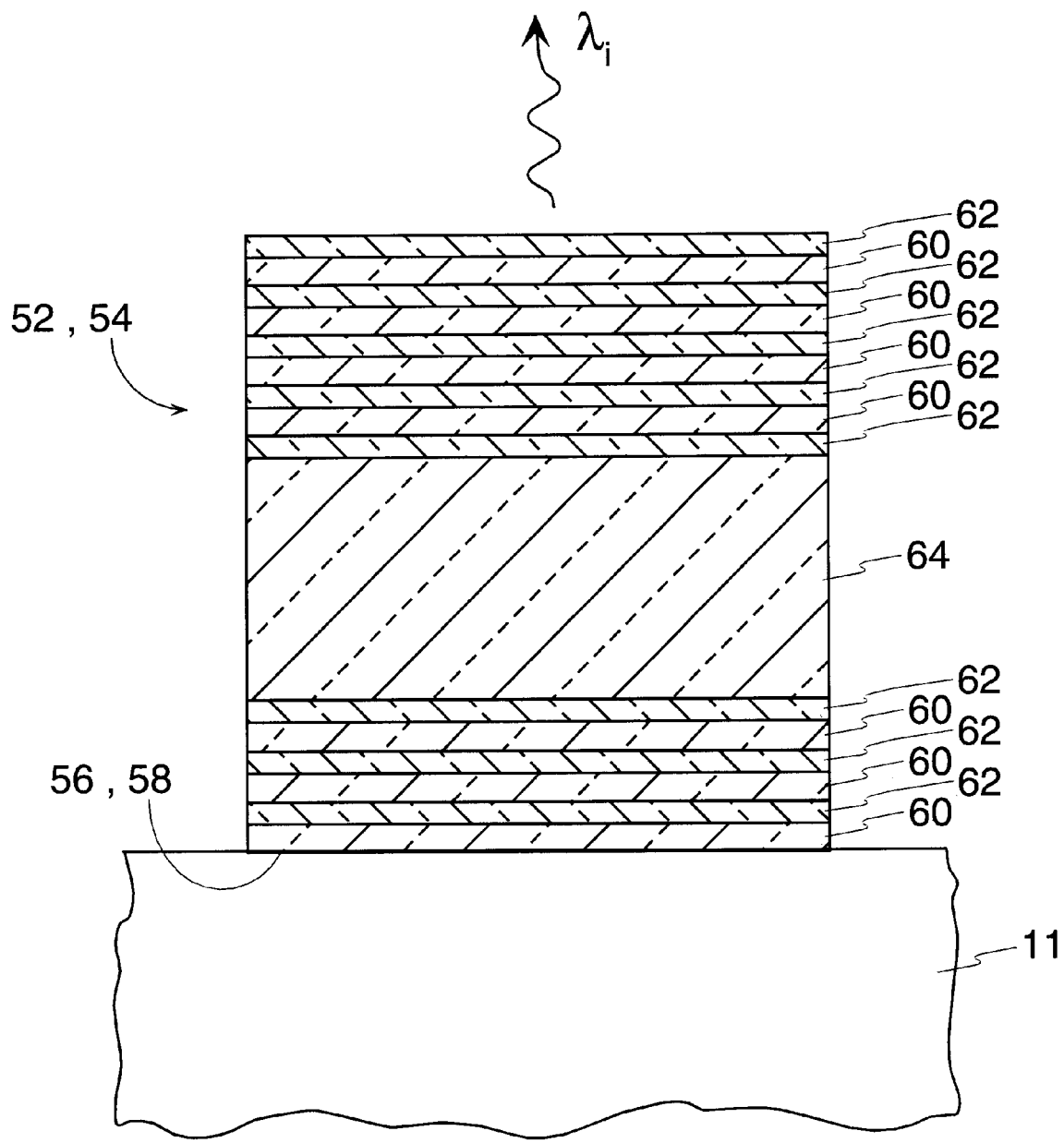
FIG. 5 is a cross-sectional view of narrow-band dielectric interference filter.

Each of the dielectric filters 52, 54 has a structure illustrated schematically in cross-section in FIG. 5. The described embodiment includes an etalon structure of 16 layers grown on the chip facet 56, 58. The first six layers are alternating layers 60, 62 of a low-index material and a high-index material. In the example, the high-index material is silicon nitride ($Si_3N_4$) having a refractive index n=1.90 and silicon dioxide ($SiO_2$) having n=1.4429. These materials will be referred to simply as nitride and oxide, especially in view of the fact that their composition may vary somewhat from the listed stoichiometry. Each of the layers 60, 62 has a respective thickness $S_j$ given by $$s_j = \frac{\lambda_i}{4n_j},$$

where $\lambda_i$ is the resonant frequency for that mirror 52, 54 and $n_j$ is the refractive index for that layer 60, 62. This thickness $s_i$ may be characterized as corresponding to an optical thickness (taking into account the refractive index) that is a quarter wavelength. For the above listed materials applied to infrared wavelength of 1.55 um, the nitride thickness is about 203.9 and the oxide thickness is about 268.5 nm. As will be discussed below, the two mirrors have slightly different resonant wavelengths $\lambda_i$. The seventh layer is a cavity layer 64 having a thickness $S_{c,i}$ given by $$s_{c,i} = 2M \frac{\lambda_i}{4n_c},$$

where M is a positive integer and $n_c$ is the refractive index of the cavity layer 64. In the example, the cavity layer 64 is the low-index oxide material, but the structure can be modified so that the cavity layer is the high-index material sandwiched by two interference mirrors beginning with low-index material. Nine more alternating quarter-wavelength layers 60, 62 are formed above the cavity layer 64 beginning with the high-index nitride material.

There are two ways to characterize the structure of FIG. 5. In the first characterization, although the cavity layer 64 has a thickness that is a multiple of half wavelength, in view of a quarter wavelength of that thickness being part of the regular alternation of the high-index and low-index layers 60, 62, it has the effect of adding a quarter wavelength. Any extra half-wavelength multiples in the cavity layer 64 sharpen the peak to be described immediately. In the second characterization, the structure of FIG. 5 is a resonant cavity structure of resonant length with the dielectric cavity layer 64 surrounded by two interference mirrors. This is well known Fabry-Perot interference filter having a general reflectance spectrum shown in FIG. 6.

Although the transmission spectrum of a Fabry-Perot interference filter can be calculated numerically, a closed form for its transmissivity $t_f$ as a function of wavenumber $k_j$ (inverse of wavelength) is conveniently given by the equation $$t_f = \frac{E_{trans}}{E_{inc}} = \frac{-t_a t_b e^{-jkl_f}}{1 - r_a r_b e^{-2jkl_f}},$$

where $t_u$ and $t_b$ are the transmissivities respectively of the top and bottom stacks of alternating layers 60, 62 as viewed from the mirror cavity 64, $r_u$ and $r_b$ are the corresponding reflectivities, and $l_f$ is the optical thickness of the mirror cavity 64. The approximate magnitudes of the transmissivities and reflectivities for the two stacks of the mirrors 52, 54 of FIG. 5 are listed in TABLE 1.

TABLE 1

| | |
|---|---|
| $|r_a|$ | 0.84 |
| $|t_a|$ | 0.54 |
| $|r_b|$ | 0.92 |
| $|t_b|$ | 0.40 |

Figure 6:
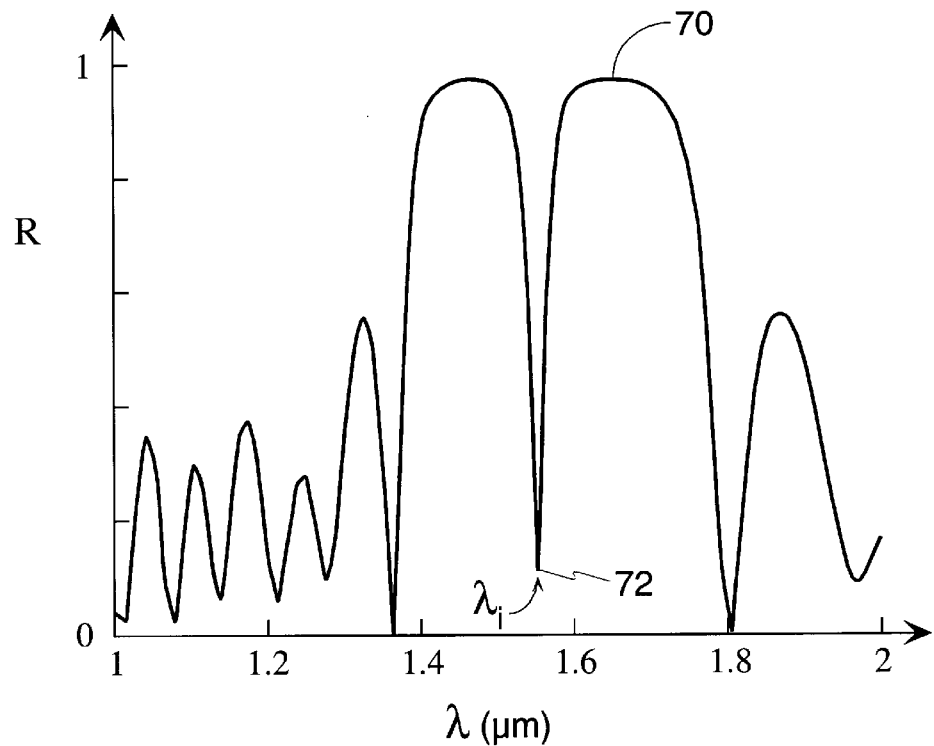
FIG. 6 is a graph of the reflectance from a dielectric interference filter of FIG. 5.
Figure 7:
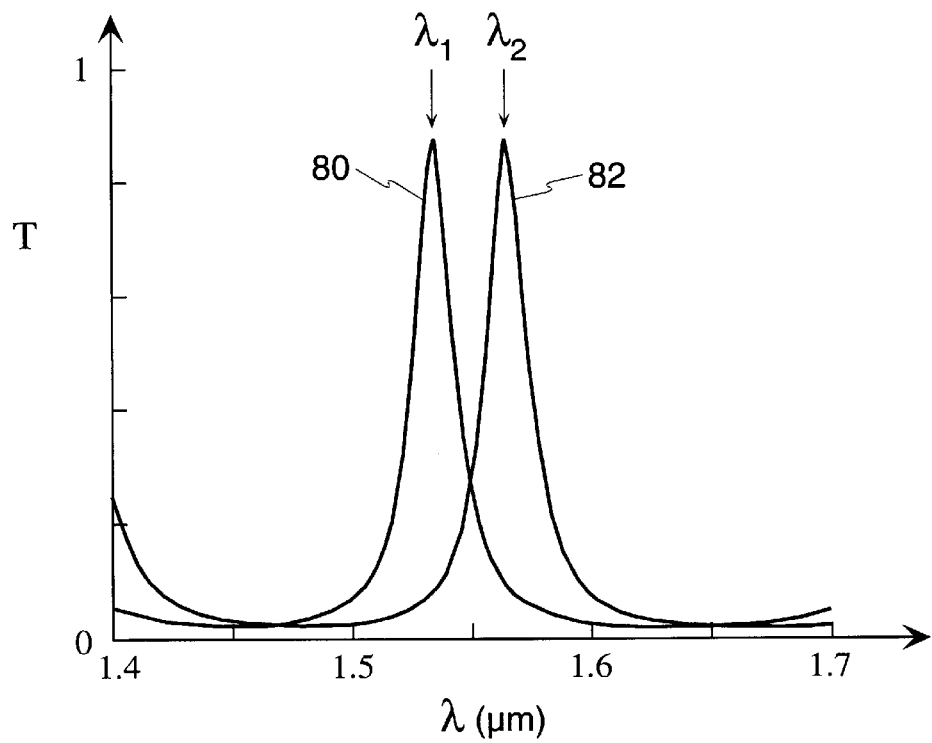
FIG. 7 is a graph of transmittances of two interference filters having differing design wavelengths and applied to opposing ends of the laser cavity of FIG. 4.

The spectrum shown in FIG. 6 is numerically calculated. It has a relatively flat top 70 that is close to unity for a sufficiently large number of interference pairs. However, a notch 72 is formed in its center. This notch corresponds to radiation partially trapped in the resonant cavity layer 64 between the two interference mirrors formed on its sides. It is known that the width of the notch 72 can be made as small as 0.5 nm. The dip in reflectance at the notch 72 can be alternatively represented as a peak in the transmittance, as shown by transmittance spectrum 80, shown in the graph of FIG. 7 designed to have a peak 80 at a wavelength $\lambda_1$ of 1530 nm. Similar physics have been applied to the Bragg reflector 16 of the prior art edge-emitting laser of FIG. 1 which utilizes such a quarter-wavelength shifted grating to achieve a laser bandwidth associated with the reflectance notch 72 or transmittance peak 80 rather than of the much wider Bragg reflectance peak.

Figure 8:
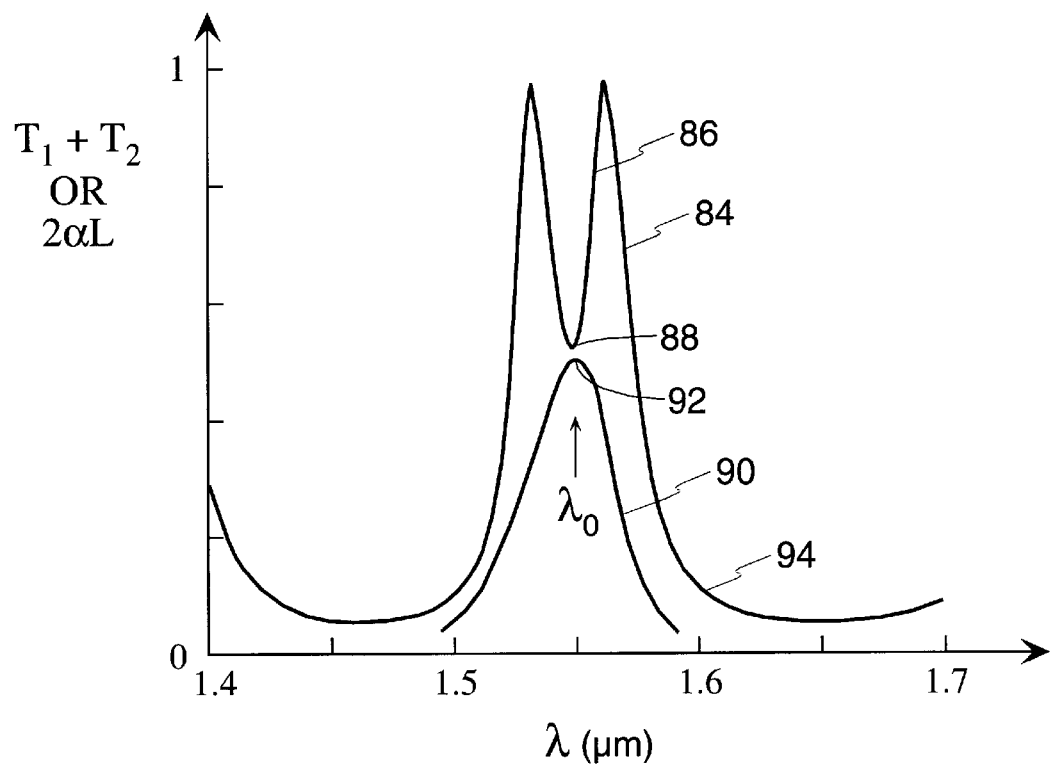
FIG. 8 is a graph of both the sum of the transmittances of FIG. 7 as well as the gain spectrum of the laser cavity.

According to one aspect of the invention, the two dielectric filters 52, 54 are designed with resonant wavelengths differing by about 1%. The wavelength-dependent transmittance $T_1$, for the first filter 52 designed for resonance at $\lambda_1$=1.53 $\mu$m is given by curve 80, and the transmittance $T_2$ for the second filter 54 designed for resonance at $\lambda_2$=1.55 $\mu$m is given by curve 82. Both filter transmittances result in cavity loss. The round-trip cavity end loss due to transmittance is $T_1+T_2$, which is plotted by a double-peaked curve 84 in FIG. 8. The round-trip cavity end loss 84 has a fairly sharp dip or notch 86 with a deep minimum 88 at $\lambda_0$, the design emission wavelength of the laser. Superimposed on this graph is a round-trip gain spectrum 90 generally equal to $2\alpha L$, which is designed to have a peak 92 at $\lambda_0$. The gain spectrum 90 has a width that is broader than the width of the notch 86 for the transmittance spectrum 84, but it should not be substantially broader than the width of the double-peaked transmittance spectrum 84.

Lasing will occur at an allowed mode having some wavelength if the round-trip gain for that mode exceeds the sum of the transmittances at the two filters (that is, mirror loss) plus any other cavity loss, which tends to be fairly broadband. Assuming the two spectra 84, 90 are reasonably aligned at $\lambda_0$, lasing will occur, if it does occur, at or near the wavelength of the transmittance minimum 88 because the transmittance notch 86 is narrower than the gain width 90. The maximum difference between gain and loss occurs at the wavelength of transmittance minimum 88, and the mode with least loss will drain pump power from less favorable modes. The laser cavity needs to be long enough that the modes are spaced closely enough that one mode falls close to the transmittance minimum 88. The gain width needs to be limited. If the gain spectrum 90 is too wide, there may be wavelengths on the tails 94 of the transmittance spectrum 84 at which the gain less loss is larger than at $\lambda_0$ and greater than unity, thus causing lasing to preferentially occur there.

The temperature dependence of the optical properties of dielectrics is about one-tenth that of semiconductors so that a temperature sensitivity of less than 0.01 nm/° C. can be achieved. That is, the lasing wavelength is stabilized to 0.2 nm for a 20° C. temperature swing. Furthermore, temperature compensated dielectric coating materials are commercially available, for example, Corning BCD C2060.

Figure 9:
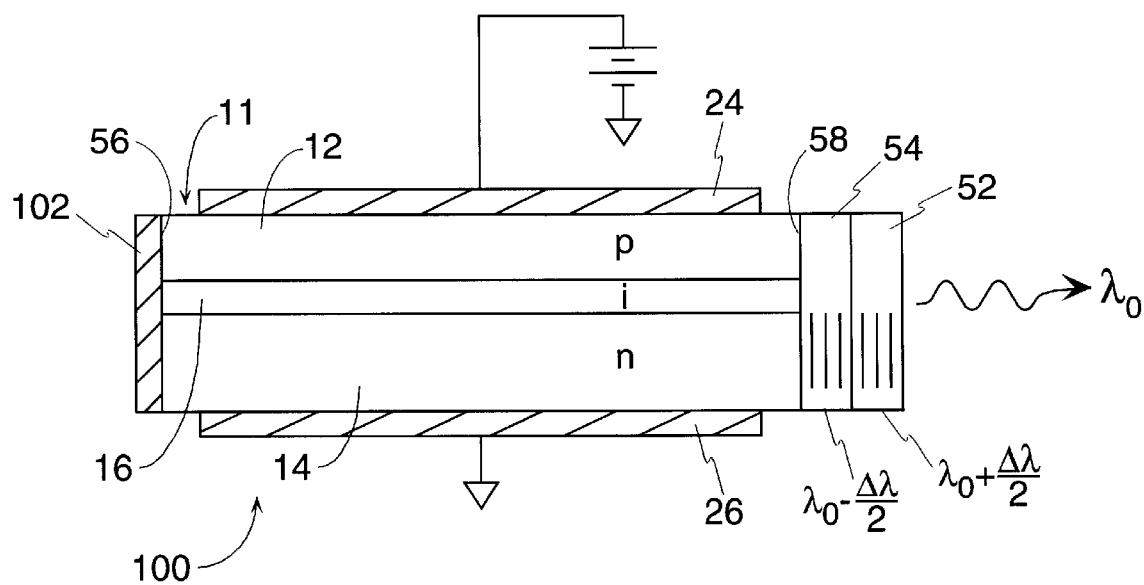
FIG. 9 is a schematic cross-sectional view of a second embodiment of an edge-emitting laser of the invention.

An alternative design, illustrated in the cross-sectional view of FIG. 9 produces an edge-emitting laser 100 similar to the laser of FIG. 4 except both interference filters 52, 54 are placed on the facet 58 on the output end. The physics becomes more complicated than simply combining two Fabry-Perot mirrors because of the optical interactions at one end of the laser, and the design of FIG. 5 will need to be modified. A metallic or other highly refractive mirror 102 is placed on the facet 56 at the other end. This design has two advantages. All the laser radiation is emitted from the end of the filters 52, 54, thus doubling the amount of laser energy readily usable. Further, the dielectric interference filters 52, 54 are formed on a single end, thus simplifying in some respects the fabrication and eliminating the wavelength dependent thickness uncertainties introduced by fabricating the two filters with significant handling in between. However, the stack thickness does become rather large.

The structure of FIG. 9 supports the characterization of one view of the invention as including a highly tuned interference filter, whether disposed on one or both ends of the laser stripe, having a spectrum with a peak that is broad and generally transmissive and of a width greater than that of the gain peak but further having a very narrow notch in the transmission spectrum that is more reflective and which determines the lasing wavelength. In the embodiment of FIG. 4, two interference filters on opposed facets 56, 58 determine the very narrow notch 86 of FIG. 8. In the embodiment of FIG. 9, two juxtaposed filters 52, 54 perform the same function. Therefore, one aspect of the invention includes an interference filter of whatever construction having a very narrow reflection peak that determines the lasing wavelength. For example, multiple Fabry-Perot filters of alternating resonant wavelengths bracketing the design wavelength may be physically juxtaposed on one end of the laser to form a single narrow-band reflective interference filter.

Importantly, lasers 50, 100 of the invention do not require a Bragg grating thus eliminating the e-beam definition of the grating. The e-beam writing is expensive, limits resolution, and reduces yield. Furthermore, with the absence of the distributed Bragg grating, the electrodes 24, 26 can be extended to cover a larger portion of the laser waveguide 56, thus providing increased round-trip gain.

The multi-layer filters 52, 54 of FIG. 5 can be easily fabricated using deposition techniques commonly applied in silicon production and development. For example, a silicon target can be RF sputtered by a plasma containing alternately oxygen or nitrogen. The sputtering continues with one species until the desired thickness is grown, and then the species is changed without even interrupting the plasma. The result is reactive sputtering producing multiple layers composed alternately of silicon dioxide or silicon nitride. A similar process is possible in chemical vapor deposition (CVD) using silane as one of the precursors and alternately adding oxygen or nitrogen. E-beam deposition is also possible. Laser chips are usually cleaved to produce flat facets at the two ends of the laser cavity. These facets are coated by placing the chip edgewise in the deposition beam with the facet to be coated facing perpendicular to the beam or at some angle to the beam.

Figure 10:
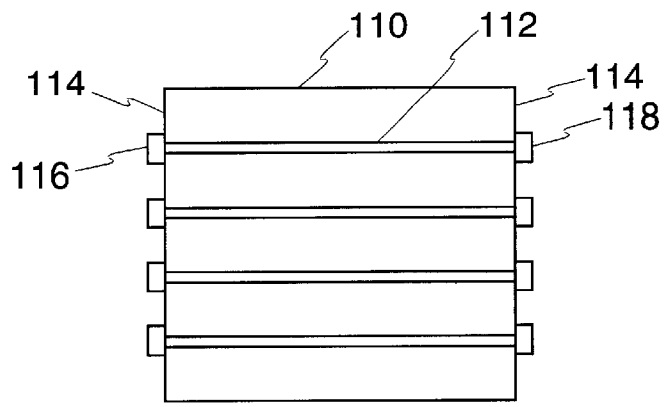
FIG. 10 is a plan view of a multi-wavelength semiconductor laser having different interference filters formed on different laser stripes.

A multi-wavelength laser useful in WDM telecommunication systems is based on an opto-electronic chip 100, as illustrated in plan view in FIG. 10, having multiple laser stripes 112 extending between the two facets 114 of the chip 110. The facets 114 in the neighborhood of the ends of the stripes 112 are coated with respective dielectric interference filters 116, 118 having resonant wavelengths designed to be $$\lambda_{0,i} \pm \frac{\Delta\lambda}{2},$$

where $\lambda_{0,i}$ is the design emission wavelength for the i-th stripe 112, $\Delta\lambda$ is an offset equal to about 1% or even 0.2% of $\lambda_{0,i}$ and the plus and minus signs refer to the opposing facets 114. That is, the filters 116, 118 are fabricated with different periods to produce different emission wavelengths among the strips 112. It does not matter which facet 114 is coated with which filter 116, 118, even with different conventions applying to different stripes 112. The gain spectrum should have sufficient width that the emission wavelengths $\lambda_{0,i}$ for all stripes 112 are principally determined by the transmittances $T_{1,i}+T_{2,i}$ of filters 116, 118 associated with the respective stripes 112. If the desired emission wavelength occurs in a portion of the gain spectrum that is significantly below the peak gain, for example, at less than 50% or even 25% of the peak value, the behavior becomes much more complicated. Of course, the combined filter of FIG. 9 may also be applied to a multi-wavelength laser.

Figure 11:
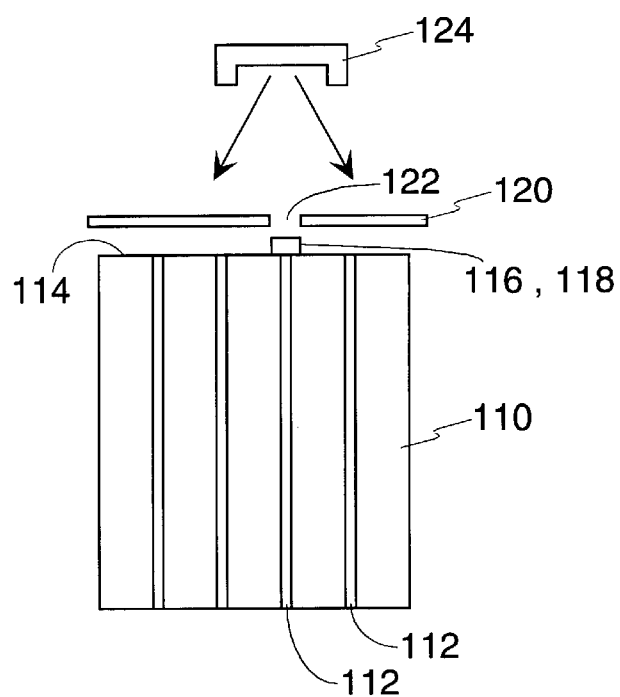
FIGS. 11 and 12 are schematic illustrations of two methods of forming different interference filters on one facet of an opto-electronic chip.

Depositing the filters 116, 118 on a single facet 114 can be done in at least two ways. The stripes 112 are sufficiently separated that, as illustrated in FIG. 11, a mask 120 with an aperture 122 can be interposed between a directional deposition source 124, such as a sputtering target, and the facet 114 of the chip 110. One stripe 112 is aligned with the mask aperture 122 so only it and not the other stripes 112 have their one ends coated with the interference filter 116, 118.

Figure 12:
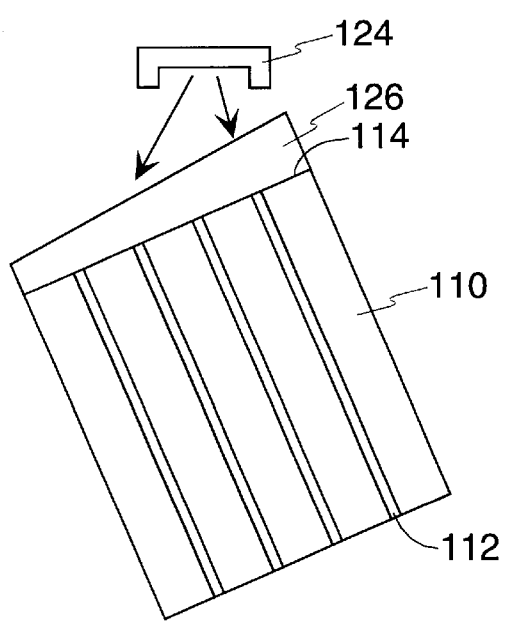

Alternatively, as illustrated in FIG. 12, the chip 110 is canted with respect to the axis of symmetry of the source 124 so that one end of the facet 114 is closer to the source 124 than the other end. In many sputter reactor geometries, the thickness of deposition decreases with increasing separation of the source from the substrate being coated. As a result, an interference filter 126 in the shape of a truncated wedge is formed on the facet 114. Since many of the pertinent design rules linearly relate distance with wavelength, the wedge-shaped interference filter 116, 118 can be matched to the required filtering characteristics for the respective stripes 112.

As for the semiconductor pump laser, the asymmetric interference filters of the invention are designed to provide sufficient wavelength selection to eliminate the multiple output modes.

Although the above example used $SiO_2$ and $Si_3N_4$, other dielectric combinations are possible. Alumina ($Al_2O_3$) is another possible dielectric. Sometimes high-resistivity semiconducting silicon (Si) is used in combination with a dielectric to form a dielectric stack. Yet other dielectrics may be chosen as long the combination presents adequate contrast in the refractive index.

The invention thus provides a more thermally stable laser and one that is more easily fabricated. The invention is also applicable to multi-wavelength lasers.

What is claimed is:

1. An edge-emitting semiconductor laser, comprising:

a substrate;

a semiconductor laser stripe formed in said substrate and extending between opposed facets of said substrate and capable of significant optical gain at a design emission wavelength; and first and second dielectric narrow-band interference filters formed on at least one of said opposed facets and having respective wavelength peaks of transmittance falling on opposite wavelength sides of said design emission wavelength.

2. The laser of claim 1, wherein said filters are formed on respective ones of said opposed facets.

3. The laser of claim 2, wherein each of said interference filters comprise pairs of layers of approximately quarter-wavelength optical thickness and of alternating values of refractive index, and in a central portion of said pairs of layers a cavity layer having an optical thickness of one or a multiple of a half-wavelength to thereby add a quarter wavelength to said pairs of layers.

4. The laser of claim 1, wherein a plurality of said stripes are formed in a substrate each having a different respective design emission wavelengths and wherein a plurality of said first and second interference filters are formed on said facets in correspondence to stripes and having resonant wavelengths pairwise bracketing said different design emission wavelengths.

5. The laser of claim 1, wherein said laser stripe contains no frequency-selective grating and an emission wavelength of said laser is determined by said first and second filters.

6. An edge-emitting laser, comprising:

a waveguide laser stripe formed in a semiconductor chip and extending between opposed first and second facets of said chip and having a gain spectrum having a peak at a first wavelength;

a first Fabry-Perot interference filter formed on said chip to intercept light from said stripe and having a reflectivity notch at a second wavelength;

a second Fabry-Perot interference filter formed on said chip to intercept light from said stripe and having a reflectivity notch at a third wavelength;

wherein said second and third wavelengths differ by no more than 2% and bracket said first wavelength.

7. The laser of claim 6, wherein said gain spectrum has a full-width half-maximum width of not substantially more than a difference between said second and third wavelengths.

8. The laser of claim 6, wherein said gain spectrum has a full-width half-maximum width no greater than a full-width half-maximum width of a sum of said notches of reflectivities of said first and second filters.

9. The laser of claim 6, wherein said two interference filters are formed on opposed facets of said chip.

10. The laser of claim 6, wherein said two interference filters are composed of a plurality of layers of at least two materials at least one of which is chosen from the group consisting of silica, silicon nitride, and alumina.

11. A multi-wavelength laser, comprising:

a vertical structure including p-type and n-type layers formed in a semiconductor chip;

a plurality of laser stripes formed in said vertical structure and extending from a first facet to a second facet of said chip; and for each of said laser stripes a first dielectric interference mirror formed on said first facet at an end of said each laser stripe and a second dielectric interference mirror formed on said second facet at another end of said each laser stripe, said first mirror having a transmittance spectrum having a notch at a first notch wavelength thereof, said second mirror having a transmittance spectrum having a notch at second notch wavelength thereof, said first and second wavelengths differing by no more than 5%, thereby producing an emission wavelength for said each laser stripe intermediate said first and second notch wavelengths, wherein said plurality of laser stripes in combination output a plurality of emission wavelengths.

12. The multi-wavelength laser of claim 11, wherein each of said interference mirrors comprise alternating layers of two respective refractive index and of quarter-wavelength optical thicknesses with respect to a respective one of said notch wavelengths and a cavity layer disposed in a central portion of said alternating layers and having an optical thickness that is an integral multiple of a half of said respective notch wavelength.

* * * * *